United States Patent [19]

Hoelzle

[11] Patent Number: 4,955,041

[45] Date of Patent: Sep. 4, 1990

[54] ELECTRONIC PULSE COUNTER FOR SIMULTANEOUS DOWNWARD AND UPWARD COUNTING

[75] Inventor: Josef Hoelzle, Munich, Fed. Rep. of Germany

[73] Assignee: Siemens Aktiengesellschaft, Munich, Fed. Rep. of Germany

[21] Appl. No.: 304,190

[22] Filed: Jan. 30, 1989

[30] Foreign Application Priority Data

Jan. 28, 1988 [DE] Fed. Rep. of Germany ....... 3802530

[51] Int. Cl.⁵ .................... H03K 21/12; H03K 23/86
[52] U.S. Cl. ........................................ 377/54; 377/33; 377/45; 377/56
[58] Field of Search ............... 377/33, 34, 41, 45, 377/54, 55, 56

[56] References Cited

U.S. PATENT DOCUMENTS

| | | | |
|---|---|---|---|
| 3,174,106 | 3/1965 | Urban | 377/67 |
| 3,411,094 | 11/1968 | Martinek | 377/54 |
| 3,571,573 | 3/1971 | Ott | 377/56 |
| 3,609,311 | 9/1971 | Wayne | 377/56 |
| 3,681,574 | 8/1972 | Caulkin | 377/55 |
| 3,987,429 | 10/1976 | Manduley et al. | 377/54 |
| 4,250,401 | 2/1981 | Sumida | 377/54 |

OTHER PUBLICATIONS

IBM Technical Disclosure Bulletin, vol. 27, No. 1a, Jun. 1984, pp. 181-182, New York, U.S.; G. E. Hack: "Universal Counter Function Utilizing a Shift Regtister Latch String"; FIGS. 1-3; pp. 181-182 are pertinent.
Electronic Design, vol. 17, No. 13, Jun. 21, 1969, pp. 87-88, Rochelle Park, U.S.; G. V. Butler: "Build Versatile Counters with D-Type Flip-Flops"; FIG. 1; Column 2, Lines 1-16 are pertinent.
German Brochure: Tietze-Schenk, "Halbleiter-Schaltungstechnik", Springer-Verlag, Auflage 1980, pp. 494-501; p. 494 ff is pertinent.

Primary Examiner—John S. Heyman
Attorney, Agent, or Firm—Herbert L. Lerner; Laurence A. Greenberg

[57] ABSTRACT

An electronic pulse counter includes a given number of shift registers each having a different number of memory elements, an input, an output and a clocking line. Each of the shift registers is countercoupled by a negation between the input and the output thereof. A pulse counter input is formed by interconnection of the clocking lines of all of the shift registers. Pulse counter outputs are formed by the outputs of the shift registers.

5 Claims, 2 Drawing Sheets

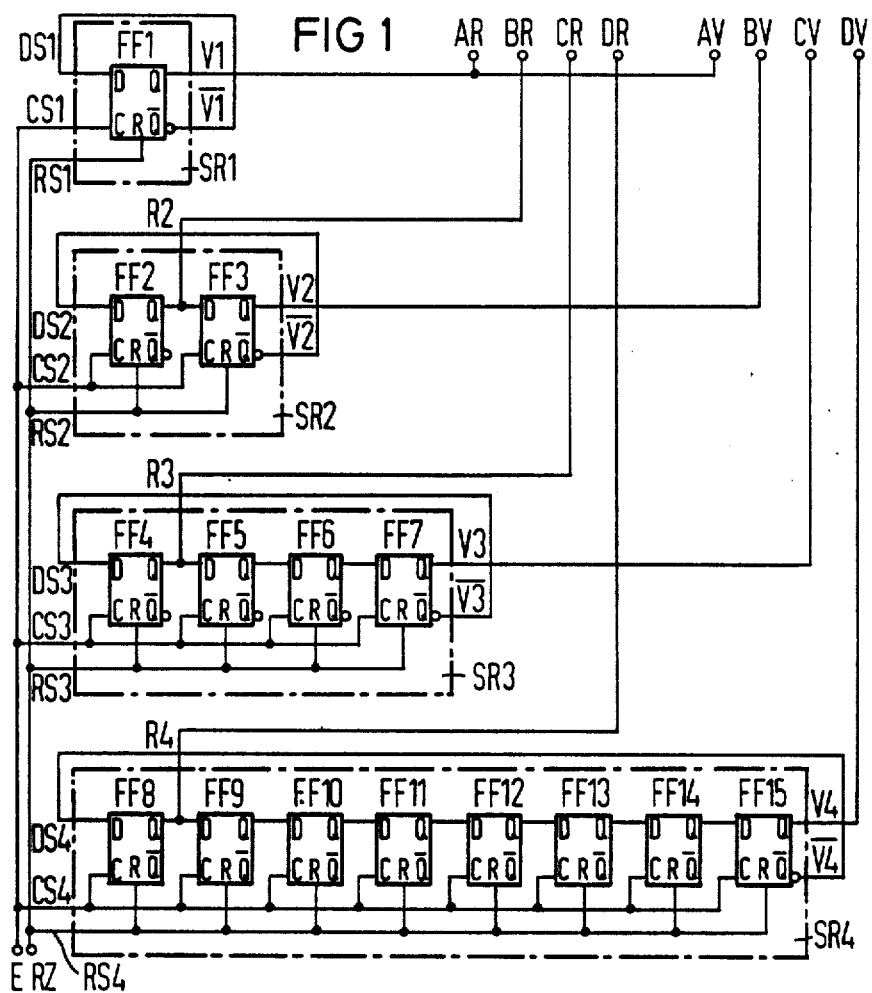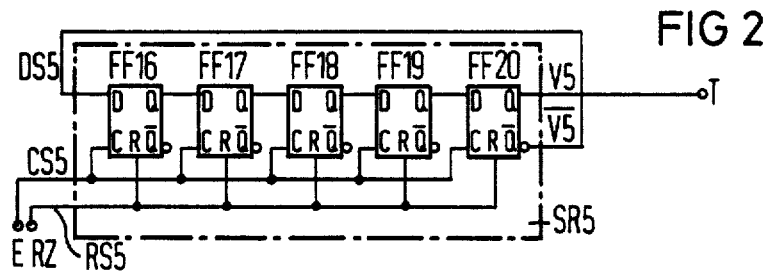

| pulse | counting up | | | | | | counting down | | | | | |
|---|---|---|---|---|---|---|---|---|---|---|---|---|
| E | AV | BV | CV | DV | | | AR | BR | CR | DR | | |
| 0. | 0 | 0 | 0 | 0 | = | 0 | 0 | 0 | 0 | 0 | = | 0 |
| 1. | 1 | 0 | 0 | 0 | = | 1 | 1 | 1 | 1 | 1 | = | 15 |
| 2. | 0 | 1 | 0 | 0 | = | 2 | 0 | 1 | 1 | 1 | = | 14 |
| 3. | 1 | 1 | 0 | 0 | = | 3 | 1 | 0 | 1 | 1 | = | 13 |
| 4. | 0 | 0 | 1 | 0 | = | 4 | 0 | 0 | 1 | 1 | = | 12 |
| 5. | 1 | 0 | 1 | 0 | = | 5 | 1 | 1 | 0 | 1 | = | 11 |
| 6. | 0 | 1 | 1 | 0 | = | 6 | 0 | 1 | 0 | 1 | = | 10 |
| 7. | 1 | 1 | 1 | 0 | = | 7 | 1 | 0 | 0 | 1 | = | 9 |
| 8. | 0 | 0 | 0 | 1 | = | 8 | 0 | 0 | 0 | 1 | = | 8 |
| 9. | 1 | 0 | 0 | 1 | = | 9 | 1 | 1 | 1 | 0 | = | 7 |
| 10. | 0 | 1 | 0 | 1 | = | 10 | 0 | 1 | 1 | 0 | = | 6 |
| 11. | 1 | 1 | 0 | 1 | = | 11 | 1 | 0 | 1 | 0 | = | 5 |
| 12. | 0 | 0 | 1 | 1 | = | 12 | 0 | 0 | 1 | 0 | = | 4 |
| 13. | 1 | 0 | 1 | 1 | = | 13 | 1 | 1 | 0 | 0 | = | 3 |
| 14. | 0 | 1 | 1 | 1 | = | 14 | 0 | 1 | 0 | 0 | = | 2 |
| 15. | 1 | 1 | 1 | 1 | = | 15 | 1 | 0 | 0 | 0 | = | 1 |
| 16. | 0 | 0 | 0 | 0 | = | 0 | 0 | 0 | 0 | 0 | = | 0 |
| 17. | 1 | 0 | 0 | 0 | = | 1 | 1 | 1 | 1 | 1 | = | 15 |
| 18. | 0 | 1 | 0 | 0 | = | 2 | 0 | 1 | 1 | 1 | = | 14 |
| 19. | 1 | 1 | 0 | 0 | = | 3 | 1 | 0 | 1 | 1 | = | 13 |
| 20. | 0 | 0 | 1 | 0 | = | 4 | 0 | 0 | 1 | 1 | = | 12 |

FIG 3

ELECTRONIC PULSE COUNTER FOR SIMULTANEOUS DOWNWARD AND UPWARD COUNTING

The invention relates to an electronic pulse counter.

Typically, electronic pulse counters are in the form of asynchronous or synchronous dual counters. Synchronous dual counters are advantageously used for high pulse train frequencies, because of the fundamentally higher threshold frequency of asynchronous dual counters. Synchronous dual (i.e. "binary") counters as a rule are formed of a plurality of memory elements connected to one another through a combinatorial logic circuit. The threshold frequency of the synchronous dual counter depends on the switching time of a memory element and on the transit time of the combinatorial logic circuit. Since the expense for circuitry for the combinatorial logic circuit increases disproportionately with the number of counter stages, the threshold frequency of the synchronous dual counter is considerably restricted thereby, as seen in the book by Tietze and Schenk, entitled "Halbleiterschaltungstechnik" [Semiconductor Circuitry], Springer-Verlag, 5th edition, 1980, pp. 494 ff.

It is accordingly an object of the invention to provide an electronic pulse counter, which overcomes the hereinaforementioned disadvantages of the heretofore-known devices of this general type and which has a high threshold frequency that is independent of the number of stages it contains.

With the foregoing and other objects in view there is provided, in accordance with the invention, an electronic pulse counter, comprising a given number of shift registers each having a different number of memory elements, an input, an output and a clocking line: each of the shift registers being countercoupled by means of a negation between the input and the output thereof; a pulse counter input formed by interconnection of the clocking lines of all of the shift registers in common; and pulse counter outputs formed by the outputs of the shift registers.

The advantage of the invention is that it avoids the need for a combinatorial logic, which contributes to lowering the threshold frequency due to the transmit time thereof, when constructing the pulse counter. Since all of the memory elements are switched simultaneously through the clocking line, the threshold frequency is determined exclusively by the switching time of the slowest memory element of the entire circuit configuration.

In accordance with another feature of the invention, the memory elements of each of the shift registers include a first memory element, and the outputs of the first memory elements of each of the shift registers form further pulse counter outputs. The advantage of this structure is that a pulse counter that counts downward is attained without entailing additional expense for circuitry. It is also advantageous that the results of the upward and downward counting process are simultaneously available at various outputs.

In accordance with a further feature of the invention, the each of the shift registers include a reset line, and the reset lines of all of the shift registers are interconnected to form a pulse counter reset line. The advantage of this structure is that the counter can be put in a defined basic state by sending a pulse to the reset line.

In accordance with an added feature of the invention, the shift registers are formed of non-transparent memory elements. The advantage of this structure is that shift registers constructed in this way have greater operational reliability.

In accordance with an additional feature of the invention, the memory elements in the shift registers are D flip-flops or JK flip-flops. It is advantageous to use such flip-flops because they are the most widely available non-transparent memory elements.

In accordance with yet another feature of the invention, the number of memory cells of the shift registers are equal to powers of 2, beginning with the power 0. The advantage of this structure is that a dual counter is attained In accordance with a concomitant feature of the invention, the given number of shift registers is one, and the one shift register is formed of a given number of memory elements. By using only one countercoupled shift register including a given number of memory elements in the circuit configuration described at the outset above, a frequency divider is formed which has the advantage of having a divider ratio which does not include only a power of 2, as is typically the case, but rather a multiple of 2.

Other features which are considered as characteristic for the invention are set forth in the appended claims.

Although the invention is illustrated and described herein as embodied in an electronic pulse counter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings FIG. 1 is a schematic circuit diagram of a first embodiment of a circuit configuration as mentioned above;

FIG. 2 is a circuit diagram of a second embodiment of a circuit configuration as mentioned above; and FIG. 3 is an operation chart.

Referring now to the figures of the drawing in detail and first, particularly, to FIG. 1 thereof, there is seen a four-place dual counter made up of four shift registers SR1-SR4 of different lengths. The number of memory elements FF1-FF15 of the shift registers are powers of 2 beginning with 0, so that the length thereof is defined as $2^0=1$, $2^1=2$, $2^2=4$ and $2^3=8$ memory elements. D flip-flops are used as the memory elements and by connecting the Q output of a D flip-flop to the D input of the following D flip-flop, they are connected to form a shift register The non-transparent memory elements may be JK flip-flops instead of D flip-flops. The countercoupling of a shift register is effected by connecting respective negated outputs $\overline{V1}$, $\overline{V2}$, $\overline{V3}$, $\overline{V4}$ of the shift registers SR1, SR2, SR3, SR4 to inputs DS1, DS2, DS3, DS4 thereof. Respective clocking lines CS1-CS4 and reset lines RS1-RS4 of all of the shift registers are joined and form a respective clocking line E and reset line RZ of the counter, the clocking line E being used as the counter input. The outputs V1 ... V4, R2 ... R4 of the first and last memory elements of each shift register are used as a counter output. The outputs V1, R2, R3, R4 of the first memory elements represent four places AR, BR, CR, DR or further pulse counter outputs of the downward counter, and the outputs V1, V2, V3, V4 of the last memory elements represent four places AV, BV, CV, DV of the upward counter. The value of an output is directly proportional to the number of memory elements in a particular shift register.

FIG. 2 shows a pulse counter including a shift register SR5 having five D flip-flops FF16–FF20 as memory elements. The shift register SR5 is countercoupled by means of a connection between an input DS5 and a negated output $\overline{V5}$. An output V5 and a reset line RS5 of the shift register SR5 simultaneously form an output T and a reset line RZ of the pulse counter. A clocking line CS5 of the shift register is used as an input E of the pulse counter.

Since the basic structure of the electronic pulse counters shown in the figures have been explained, the mode of operation thereof will be described in detail.

The fundamental functioning of the illustrated electronic pulse counters is based on the combination of frequency dividers having different division ratios based on shift registers. According to the mode of operation of such a frequency divider, with the counter reset, the outputs of all of the memory elements, in the present case D flip-flops, have the logical state 0. A 1 is accordingly present at the input of the first memory element, because that memory element is connected to the negated output of the shift register. If a pulse is then fed to the counter input, each memory element assumes the output state of the one preceding it, except for the first, which assumes the negated output state of the last one. The output state of the first memory element thus becomes equal to 1. Upon each further input pulse, the logical state 1 is shifted by one memory element until, as in the case of FIG. 2, all of the memory elements have the state 1 after five pulses. As a result, however, the state at the input of the first memory element is 0, which in turn appears at the output after a further five pulses.

If four such frequency dividers having one, two, four and eight memory elements, respectively, are operated in parallel as shown in FIG. 1, the result is a four-place upward-counting dual counter.

The output state of the particular frequency divider is present in negated form and delayed by one pulse at the output of the first memory element of one shift register. In a counter having the makeup shown in FIG. 1, a four-place dual number appears at the outputs of the first memory elements of the shift registers, with the sequence of this dual number being in the opposite direction from that present at the outputs of the last memory elements of each frequent divider. Thus the results of the upward and downward counting are simultaneously available at separate outputs.

In the exemplary embodiment shown in FIGS. 1 and 3, it should be noted first that all memory elements are reset. As a result, after a reset all outputs AV ... DV and AR ... DR are at a logical zero, and accordingly, all respective output values V and R are equal to zero. A first pulse at input E causes, as seen in FIG. 1, a "flip" of the first memory elements FF1, FF2, FF4 and FF8. Since the first shift register SR1 has only a single memory element FF1, there appears immediately a logical 1 at the output AV, while the other shift registers SR2, SR3, SR4 continue to show a logical zero. After the second pulse on input E, also the second shift register SR2 flips, since at this time the logical 1 has traversed memory elements FF2 and FF3. The first shift register FF1 "flops" after the second pulse again back to the logical zero state. Due to the binary length of all the shift registers, different propagation times for the respective shift registers are required, which further leads to propagation times to binary lengths. By taking the outputs from the respective last memory elements, it follows that for each pulse, the binary value present on the outputs AV ... DV, is accordingly incremented by one.

In contrast, the outputs AR ... DR, already after the first pulse, flip to a logical 1. After the second pulse only output AR changes state, and after the third pulse outputs AR and BR change state and so forth. As is the case with the outputs AV–DV, outputs AR–DR also change state according to the different propagation times, as follows: outputs AV, AR change state after each pulse; outputs BV, BR after every second pulse; outputs CV, CR after every fourth pulse, and outputs DV, DR after every 8th pulse.

The difference, however, is found in the state of the two groups after the first pulse, namely that the data word on the outputs V is equal to 1, and for outputs R is equal to 15. Since the outputs of the highest weighting DV, DR have the longest propagation delay, these outputs remain unchanged for the longest time, while the outputs with lower weightings have correspondingly lower propagation delays, and therefore change states earlier. As a result, the data words on outputs R decrease with increasing number of pulses, in other words, they count backwards.

I claim:

1. Electronic pulse counter, comprising a given number of shift registers each having a different number of memory elements, an input, an output and a clocking line; each of said shift registers being counter-coupled by means of a negation between said input and said output thereof; a pulse counter input formed by interconnection of said clocking lines of all of said shift registers; and pulse counter outputs formed by said outputs of said shift registers, wherein said memory elements of each of said shift registers include a first memory element, said outputs of said first memory elements of each of said shift registers form further pulse counter outputs, said given number of memory elements of said shift registers is equal to powers of 2, beginning with the power 0, said first outputs form an upward counter, and said further outputs form a downward counter, whereby simultaneous downward and upward counting are provided.

2. Electronic pulse counter according to claim 1, wherein each of said shift registers include a reset line, and said reset lines of all of said shift registers are interconnected to form a pulse counter reset line.

3. Electronic pulse counter according to claim 1, wherein said memory elements of each of said shift registers are non-transparent memory elements.

4. Electronic pulse counter according to claim 3, wherein said non-transparent memory elements are D flip-flops.

5. Electronic pulse counter according to claim 3, wherein said non-transparent memory elements are JK flip-flops.

* * * * *